United States Patent [19]

Pappas

[11] Patent Number: 4,755,969
[45] Date of Patent: Jul. 5, 1988

[54] PSEUDO RANDOM SEQUENCE GENERATION

[75] Inventor: Andreas Pappas, Freehold, N.J.

[73] Assignee: Digital Electronic Communications Equipment (DECE Corp.), Freehold, N.J.

[21] Appl. No.: 928,189

[22] Filed: Nov. 7, 1986

[51] Int. Cl.4 .................. G11C 11/40; G11C 13/00
[52] U.S. Cl. .................................. 365/189; 365/230; 307/445
[58] Field of Search ............... 365/189, 230; 307/445

[56] References Cited

U.S. PATENT DOCUMENTS 4,596,002 6/1986 Chan et al. .................. 365/189
4,600,846 7/1986 Burrows ...................... 307/445

Primary Examiner—Terrell W. Fears
Attorney, Agent, or Firm—Gordon W. Kerr

[57] ABSTRACT

Circuits for generating sequences of pseudo random binary digits wherein the circuit can be easily programmed to change the sequence. The sequences are obtained by modulo-2 addition of digits retrieved from storage in Random Access Memories (RAMs). Two or more Read counters identify separate addresses in the RAMs from which the digits are retrieved. A Write counter points into an address in all of the RAMs where each current sequence bit is stored as it is formed at the output of an Exclusive-Or gate which performs the modulo-2 addition. Each of the Read counters lags the Write counter by a different and programmable amount and these lags determine which sequence is generated.

6 Claims, 4 Drawing Sheets

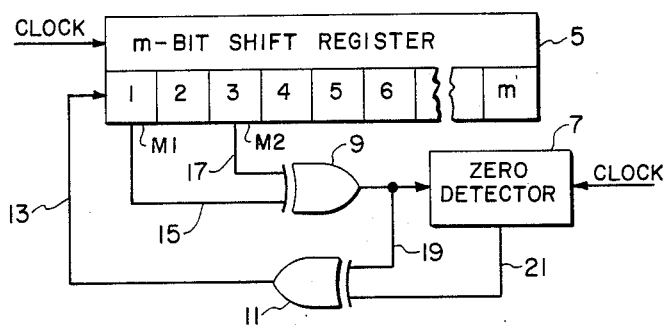
FIG. 1
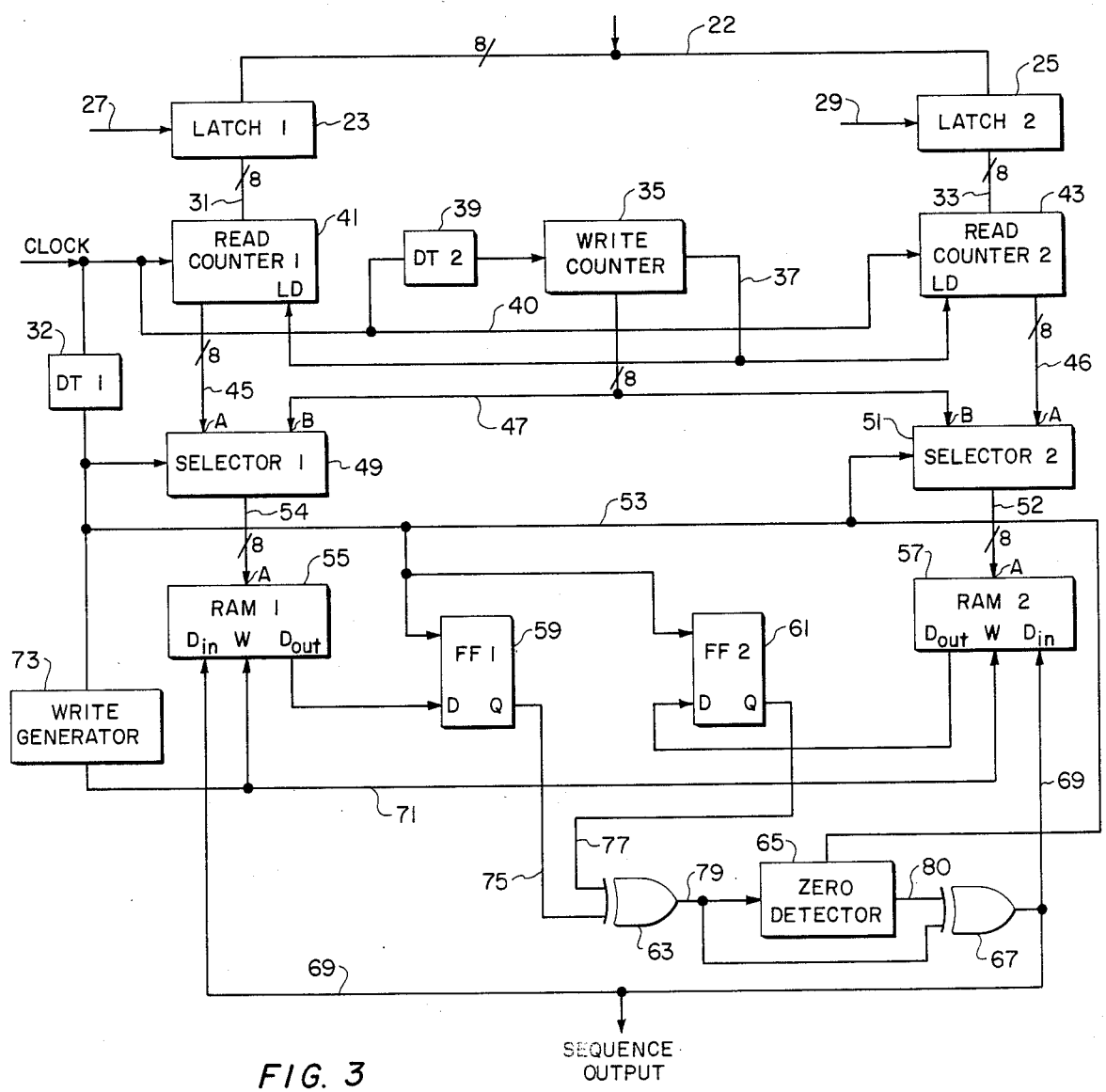
FIG. 2
FIG. 3

FIG. 4

PSEUDO RANDOM SEQUENCE GENERATION

BACKGROUND OF THE INVENTION

The field of this invention is the generation of repetitive sequences of binary digits known as pseudo random sequences, also known as pseudo noise (PN), or m-sequences. Such sequences have many applications in communications because they have good statistical and autocorrelation properties. For example, they are used to scramble digital data and intelligence signals, are used as test sequences for troubleshooting or monitoring the performance of digital communications systems or media, and are used in spread spectrum systems. Such sequences have the characteristics of random data in that the number of binary 0's and binary 1's therein is close to 50-50, yet they have predicatable autocorrelation functions, either unity or 1/N, wherein N is the number of binary digits in the sequence.

The most common method of generating such PN sequences in the prior art is the Serial Shift Register Feedback (SSRF) technique. This technique can be implemented with a shift register and one Exclusive-Or (Ex-Or) gate having as inputs the outputs of a pair of shift register stages. The gate output forms the serial input of the shift register. The data is shifted down the shift register at the rate of a clock which defines the repetition rate of the resultant PN sequence. The sequence can be obtained from any one of the register stages. The sequence at each register stage will be the same but delayed by a number of bits equal to the shift register stage position. A feedback shift register of this type can generate PN sequences of up to $N=2^m-1$ digits long, where m is the number of active register stages used. In general, a different sequence will be generated for each different pair of register stages which are connected to the inputs of the Ex-Or gate. In these prior art PN generators, if the generated sequence is to be changed, it is necessary to re-connect one or both of the gate inputs to a different shift register stage. This means that most PN generators of the SSRF type are hard-wired to generate only a single sequence or are provided with such tap-changing means as patch cords or a pair of complex programmable electronic selectors for making different connections between the register stages and the Ex-Or gate inputs.

The present invention comprises a novel method and circuitry for generating any one of a large number of PN sequences merely by appropriately programming a circuit.

SUMMARY OF THE INVENTION

In the circuit of the present invention, the PN sequence is obtained from the output of an Ex-Or gate, the inputs of which are obtained from a pair of random access memories (RAMs). A pair of Read counters function as pointers to identify separate locations or addresses in each of the RAMs. The binary digits at these separate addresses form the inputs of the Ex-Or gate which yields the PN sequence. A Write counter is operated by the system clock, which also operates both of the Read counters to determine the sequence repetition rate. The Write counter points into an address in both memories where the current sequence bit at the Ex-Or gate output is stored. The two Read counters select or point to memory locations wherein the Write counter has stored, in the past, the then current sequence bit at two different prior bit intervals. These different bit intervals are determined by the amount of lag between the readings of each of the Read counters and the Write counter. These two lags are in turn determined by a pair of digital words or numbers which are programmed into the circuit and which preset the two Read counters and thus determine the PN sequence to be generated.

It is thus an object of the invention to provide a programmable PN sequence generator wherein the digits of the sequence are obtained from the output of an Ex-Or gate, the digital inputs of which are obtained from two different addresses in a pair of memories, the different addresses being determined by the readings of a pair of Read counters each of which is connected to a different one of said memories. The binary digits so obtained from said memories being digits which were previously at different times stored in each memory at an address determined by the reading of a Write counter and wherein the readings of said Read counters each lag the reading of said Write counter by a different and programmable number of digits.

Another object of the invention is to provide a PN sequence generator comprising a pair of Read counters and a Write counter, and a pair of RAMs, wherein the readings of said Read counters are caused to lag that of said Write counter by different and programmable amounts and wherein the readings of said Read counters point to or identify different addresses in said memories, the binary contents of which are used to form the PN sequence by means of an Ex-Or gate, and wherein the reading of said Write counter points to an address in said memories where the current bit forming the output of said gate is stored.

A further object of the invention is to provide a novel method of generating pseudo random sequences.

Another object of the invention is to provide a PN generator which can generate a large number of different PN sequences by programming the generator with a pair of different binary numbers.

These and other objects and advantages of the invention will become apparent form the following detailed description and the drawings.

BRIEF DESCRIPTION OF THE DRAWINGS

FIG. 1 is a block diagram of a prior art PN generator.

FIG. 2 illustrates a PN sequence which can be generated by the circuit of FIG. 1.

FIG. 3 is a block diagram of an illustrative embodiment of the invention.

FIG. 4 is a table illustrating the operation of the circuit of FIG. 3.

DETAILED DESCRIPTION

Figure 5:
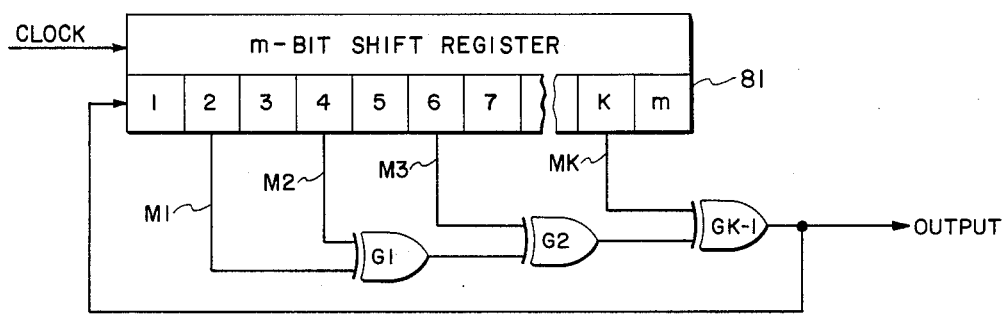
FIG. 5 is another prior art PN sequence generator.

The prior art PN generator of FIG. 1 is of the aforementioned SSRF type which includes an m-bit (or m-stage) shift register 5, the register stages being numbered from 1 to m, as illustrated. Two stages of the register, M1 and M2 are connected to the inputs of Exclusive-Or gate 9. In the illustrated circuit M1 is the first or left register stage and M2 is the third stage. The output of gate 9 on lead 19 forms one input of another Ex-Or gate 11 as well as the input of Zero Detector 7. The detector output on lead 21 is the second input of gate 11. The output of gate 11 at lead 13 forms the serial input of the register at stage 1 thereof. When this circuit is energized and at least one of the first three stages thereof is binary 1, a predetermined and unique PN sequence will be generated as the clock pulses shift the re-circulating bits down the register. The shifting of the gate inputs M1 and M2 to another pair of register stages will result in the generation of a different sequence. The sequence can be obtained from lead 13, 19 or from any of the register stages. The sequence will have a different phase at each register stage. Only the register stages up to and including the M2 stage are effective in generating the sequence, and the unused stages to the right thereof function only as time delay stages. As M2 is moved toward the right along the register, the number of bits, N, in the generated sequence will increase. The sequence length N is one less than two raised to the number of a active register stages. Thus the circuit of FIG. 1 will generate a sequence of seven digits length, ($2^3-1$). If M2 had been connected to register stage 6, N would be 63. Five different 63 bit sequences can be generated depending on which of the first 5 stages is selected for M1.

The operation of the circuit of FIG. 1 can be explained with the aid of the table of FIG. 2, which shows the contents of the register stages 1, 2 and 3 in the three columns so numbered, at several successive points in time. It is assumed that when the circuit is energized (or at some arbitrary point in time) the first and third register stages will be binary 0 and stage 2 binary 1, as shown in the first row of FIG. 2. Thus the gate 9, during the first half of the first clock pulse will have as inputs a pair of binary 0's, resulting in a binary 0 output on lead 13, which binary 0 will be shifted into register stage 1 on the second half of the clock pulse. At the same time the binary 0 of stage 1 will be shifted to stage 2 and the binary 1 of stage 2 will be shifted to stage 3. Thus during the first half of the second clock pulse the first three register stages will read 001, as shown for bit #2 in FIG. 2. The 0 and 1 inputs of gate 9 from the M1 and M2 register stages will then produce a binary 1 on lead 13 for re-circulation through the register. It should be noted that the output, 21, of of Zero detector 7 is normally 0 and thus normally the output of gate 9 merely passes through gate 11 to the register input at lead 13. By following this logical sequence and noting the truth table of Ex-Or gates, the remainder of FIG. 2 can be formed. It can be seen that the sequence repeats after the seventh bit and also that each of the columns is the same repetitive 7 bit sequence (0011101 0011101) with a phase offset of one bit between each adjacent register stage. If the register initially contained all binary 0's in its active stages, the circuit will produce a meaningless string of 0's. The Zero detector corrects this situation by producing a binary 1 at its output 21 if it detects a string of N zeros at its input. This binary 1 will be fed through gate 11 to the shift register input at lead 13 and will continue circulating through gates 9 and 11 and the register as the sequence is generated.

Assuming that the sequence is obtained at the shift register serial input at lead 13, it can be seen that each bit (or the current bit) or the sequence is obtained by modulo-2 addition (in gate 9) of the two sequence bits which occurred M1 and M2 bits previously. This follows since the sequence is fed to register stage 1 and it progresses down the register with each clock pulse to arrive at M1, in the present example shown in FIG. 1, one bit (or clock pulse) later and at M2 three bits or clock pulses later, to form the current bit at lead 13.

Instead of utilizing the Zero detector 7 and gate 11, the circuit could be provided with some means to reset, or set, one or more of the active stages of the shift register to binary 1 to insure that a valid sequence would be generated.

The novel programmable PN generator of FIG. 3 is designed to accept pairs of 8-bit words or numbers, each diffrent pair of which will produce a different PN sequence. The two 8-bit words are analogous to the register stages represented by M1 and M2 of FIG. 1. Thus the circuit of FIG. 3 is analogous to a shift register with $2^8$ or 256 stages and thus can generate sequences up to $2^{256}-1$ bits in length. The leads of FIG. 3 having slashes with the number 8 thereon indicate that these leads carry 8 bits, either on 8 parallel leads, or 8 serial bits on a single lead for each clock pulse. The lead 22 is the source of the two eight bit words or numbers used to program the circuit and thus determine the sequence generated. Lead 22 may comprise a computer bus and the two words may originate at the computer keyboard or memory. The two 8-bit programming numbers are sequentially applied to lead 22 and are separately loaded into a pair of eight bit latch circuits 23 and 25 under the control of time staggered strobe pulses applied to the latch circuits via leads 27 and 29. The timing of the strobe pulses is synchronized with the application to lead 22 of the words to be loaded. The latch circuits are essentially eight bit memories which retain the programming words as long as the sequence represented thereby is to be generated. Latch circuit #1 (23) has its eight bit output 31 connected to the eight stages of eight bit binary Read counter #1 (41), and Latch circuit #2 (25) has its output 33 similarly connected to identical Read counter #2 (43). The eight bit Write counter 35 is clocked by a delayed clock pulse from the output of delay circuit 39. Counter 35 produces a ripple carry output on lead 37 each time it reaches its capacity of 255. This ripple carry output pulse is applied to the LD (load) terminals of both Read counters and acts as a strobe pulse to set each Read counter to the number stored in its associated latch circuit. Both Read counters are connected to clock lead 40. With this circuitry the Write counter will always lead or be ahead of the Read counters by a number equal to the complement of the contents of their respective latch circuits. This is the same as saying that each Read counter lags the Write counter by a number equal to the complement of the reading of the respective latch circuits.

An eight bit two-to-one selector #1 (49) has its A inputs connected to the output lead 45 of Read counter #1 and a similar selector #2 (51) has its A inputs connected to the output lead 46 of Read counter #2. The B inputs of both selectors are connected to the output lead 47 of the Write counter. All of the counter output leads, 45, 46, and 47 carry eight bit numbers representing the current counter readings. The output of Selector 49 is connected via lead 54 to the address (A) input of $256 \times 1$ bit random access memory(RAM #1) 55, and the output 52 of Selector 51 is similarly connected via lead 52 to a similar RAM #2, 57. A D type Flip-flop #1 (59) is associated with the RAM #1 and a similar flip-flop 61 is associated with RAM #2. Both flip-flops and both selectors are clocked by pulses on lead 53 which is the output of delay circuit 32. Both memories have separate data input and output terminals, labeled as $D_{in}$ and $D_{out}$, as well as a Write terminal, W, the pulsing of which will cause the binary digit at the $D_{in}$ terminal to be written at the address indicated at the A terminal. The $D_{out}$ terminals will read out the binary digit at the address indicated by the digital number applied to the A terminal.

The selectors during the first half of each clock cycle will connect their A terminals to their output leads 54 and 52 and during the second half of each clock pulse will connect their B terminals to their same output leads. The D input terminals of both flip-flops are connected to the $D_{out}$ terminals of the associated RAMs and the Q outputs of the flip-flops form the inputs of Ex-Or gate 63. The gate 63 generates the PN sequence by the modulo-2 addition of the contents of the flip-flops. The Zero detector 65 is connected to the output of gate 63 and has its output connected to one input of gate 67, the other input of which is the output of gate 63. The detector 65 and gate 67 function as do the analogous components of the circuit of FIG. 1 to insert a binary 1 into the system if a string of N binary 0s is generated. The output 71 of Write pulse generator is applied to the Write terminals of both of the RAMs and the PN sequence on lead 69 is fed back to the $D_{in}$ terminals of both RAMs.

The operation of the circuit can be explained as follows. The Write counter is cycled by the clock pulses from 0 to 255 and it then repeats, producing a strobe or ripple carry pulse on lead 37 each time it reaches a count of 255. At this time the pulse on 37 loads Read counter #1 with the eight digit number in Latch circuit #1 and simultaneously the same pulse loads Read counter #2 with the eight digit number in Latch circuit #2. The counters then continue to be incremented by the clock pulses, with the Read counters lagging the Write counter by the complement of the number in their respective Latch circuits, as explained above. The first half or portion of each clock pulse defines a Read mode during which the selectors connect their outputs to their associated Read counters so that the memories are addressed by the Read counter readings. More particularly, during the Read mode the output lead 45 of Read counter #1 is connected through selector 49 to its output lead 54 which is connected to the A terminal of RAM #1, and at the same time the output lead 46 of Read counter #2 is connected through selector 51 to the A terminal of RAM #2. This causes the binary digit stored in each memory at the address provided by the two read counters to appear at the $D_{out}$ memory terminals. The clock pulse polarity associated with the Read mode, which in the illustrated circuit is the first or positive clock pulse polarity, will cause each of the flip-flops 59 and 61 to store the binary digit appearing at its associated RAM $D_{out}$ terminal. These digits will then appear at the flip-flop Q terminals. The gate 63 will form the current PN sequence digit from the two flip-flop outputs.

The second or negative half of each of the clock pulses defines a Write mode during which both selectors have their outputs connected to their B inputs and thus both selector outputs 52 and 54 are connected to the Write counter output lead 47. Thus during the Write mode the current reading of the Write counter will be applied to the address input, A, of both RAMs. The Write generator 73 is designed to apply a strobing pulse to the Write terminals (W) of both memories during each Write portion of each clock pulse to cause the binary digit at the $D_{in}$ memory terminals to be stored therein at the address corresponding the the current reading of the Write counter. It can be seen that both $D_{in}$ terminals are connected to the sequence output lead 69 and thus each PN sequence digit as it is generated will be stored in both memories at the address of the current reading of the Write counter. Since the Read counters are arranged to lag the Write counter by a different and programmable number of digits, it is apparent that at two different times later depending on the amount of lag of the Read counters relative to the Write counter, the current sequence bit will be fetched or retrieved from memory by the Read counters. More specifically, the current bit stored during the Write mode will be retrieved from memory when the readings of the Read counters at different later times reach the address thereof. This means that the Read counters are fetching the digits from their associated memories which were stored therein a number of past sequence digits ago equal to the lag of each Read counter relative to the Write counter. Thus the PN sequence is in effect formed by modulo-2 addition of two prior sequence digits which occurred at different times in the past. This is exactly analogous to the operation of the prior art SSRF generator described above, and the M1 and M2 connections to the shift register stages are analogous to the different amounts of lag of the Read counters and the Write counter.

Figure 4:
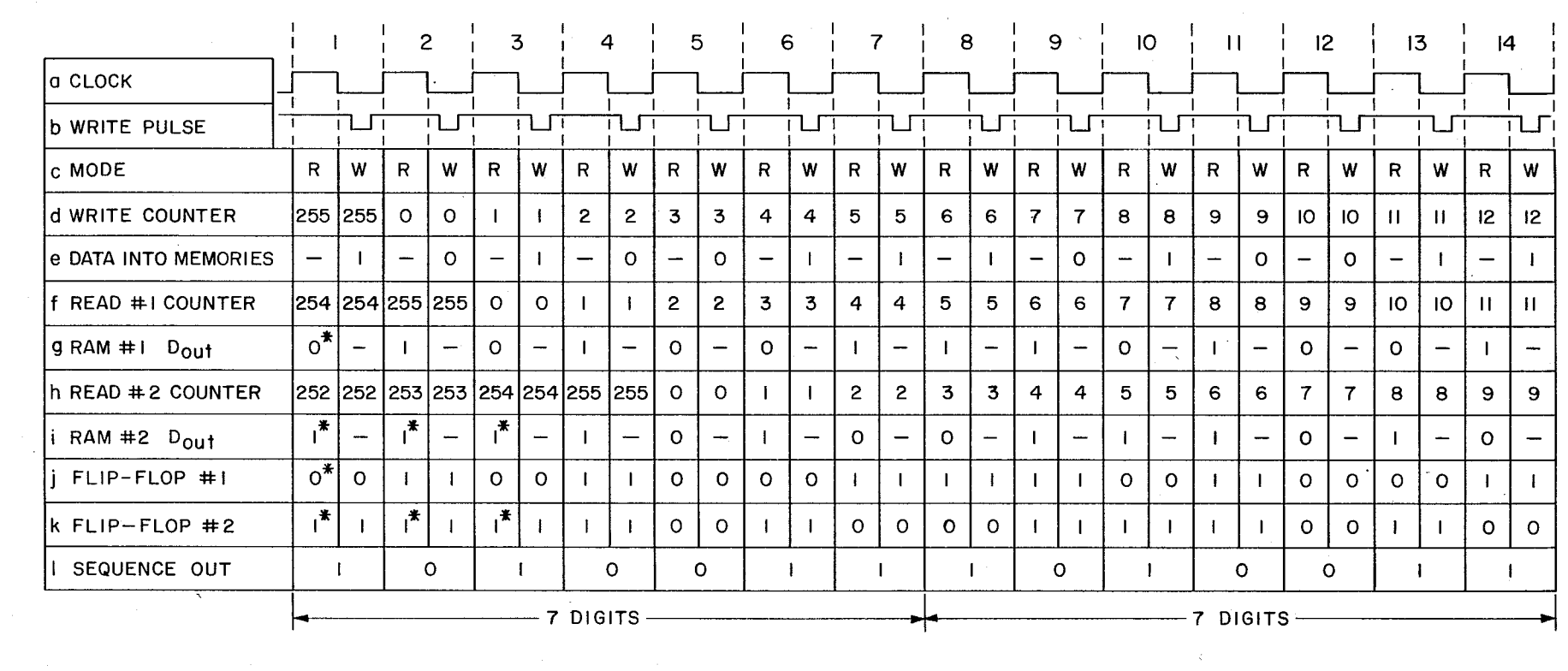

FIG. 4 shows waveforms and the contents of the counters and other logic circuits for the circuit of FIG. 3 while is operating to produce the 7-digit sequence illustrated in FIG. 2. FIG. 4 shows two cycles or 14 digits of the sequence at line 1. The first line or row, a, shows the clock pulses consisting of a first positive portion which defines the Read mode (R) and a negative portion defining the Write modes (W). The modes are shown in line c. The Write pulses of line b are the outputs of the Write generator 73 of FIG. 3. Line d shows the reading of the Write counter, starting at 255 when it reaches its capacity and produces the strobe on lead 37 of FIG. 3 to set both of the Read counters. In this case the Read counter #1 is set to 254, as shown on line f, so that it lags the Write counter by one sequence bit, and Read counter #2 is set to 252 (line h) so that it lags the Write counter by 3 sequence bits. This follows from the fact that M1 in the circuit of FIG. 1 was the first register stage and M2 the third stage. Line e of FIG. 4 shows the current sequence bit (shown in line 1) which is being stored in both memories at the address shown in line d. The first bit retrieved from RAM #1 by Read counter #1 will be either binary 0 or 1 depending on which of these binary states randomly occurred at address 254 when the circuit was energized. It is assumed that this address randomly became binary 0 and thus the digit 0 in line g during clock pulse 1 has an asterisk thereon. The other asterisks in lines i, j, and k have the same meaning. If one or more of the assumed initial binary states had been different from those illustrated, the same 7-digit sequence would be generated, but the phasing thereof would differ for each different combination of assumed initial states. Since the Read #2 counter lags the Write counter by three digits, the first three digits retrieved from RAM #2 will be of unknown binary state and in the example of FIG. 4 have arbitrarily been assumed to be binary 1s, and are thus shown with asterisks in line i. Lines j and k show the states of the two flip-flops which are determined by the two RAM outputs shown in lines g and i. Application of the truth table of Ex-Or gates to the contents of the two flip-flops yields the sequence output of line 1.

The circuit of FIG. 3 can be designed to accommodate words or numbers with different numbers of digits, so that PN sequences of different lengths can be generated.

The delay circuits 32 and 39 insure that the Write counter and the two sleectors change states at the proper time relative to the positive clock transitions. This arrangement improves high speed performance and avoids problems caused by clock bias disortion.

As indicated above, a shift register PN generator like that of FIG. 1 with only one Ex-Or gate in its feedback path does not always generate a PN sequence up to $N=2^m-1$ digits long (maximum length). In order to generate maximum length sequences, addition shift register stages are gated by more Ex-Or gates in the feedback path. Such a prior art PN shift register generator is shown in FIG. 5. This circuit comprises a shift register 81 of m stages with Ex-Or gate G1 having as inputs the outputs of register stages 2 and 4. The output of gate G1 forms one input of gate G2, the other input of which is the output of shift register stage 6. The third Ex-Or gate Gk-1 has as inputs the output of G2 and the output of register stage k. The output of Gk-1 forms the serial input of register stage 1 to form the feedback path. The PN sequence may be taken from any of the register stages. The gate inputs are labeled as M1, M2, M3 and Mk.

Figure 6:
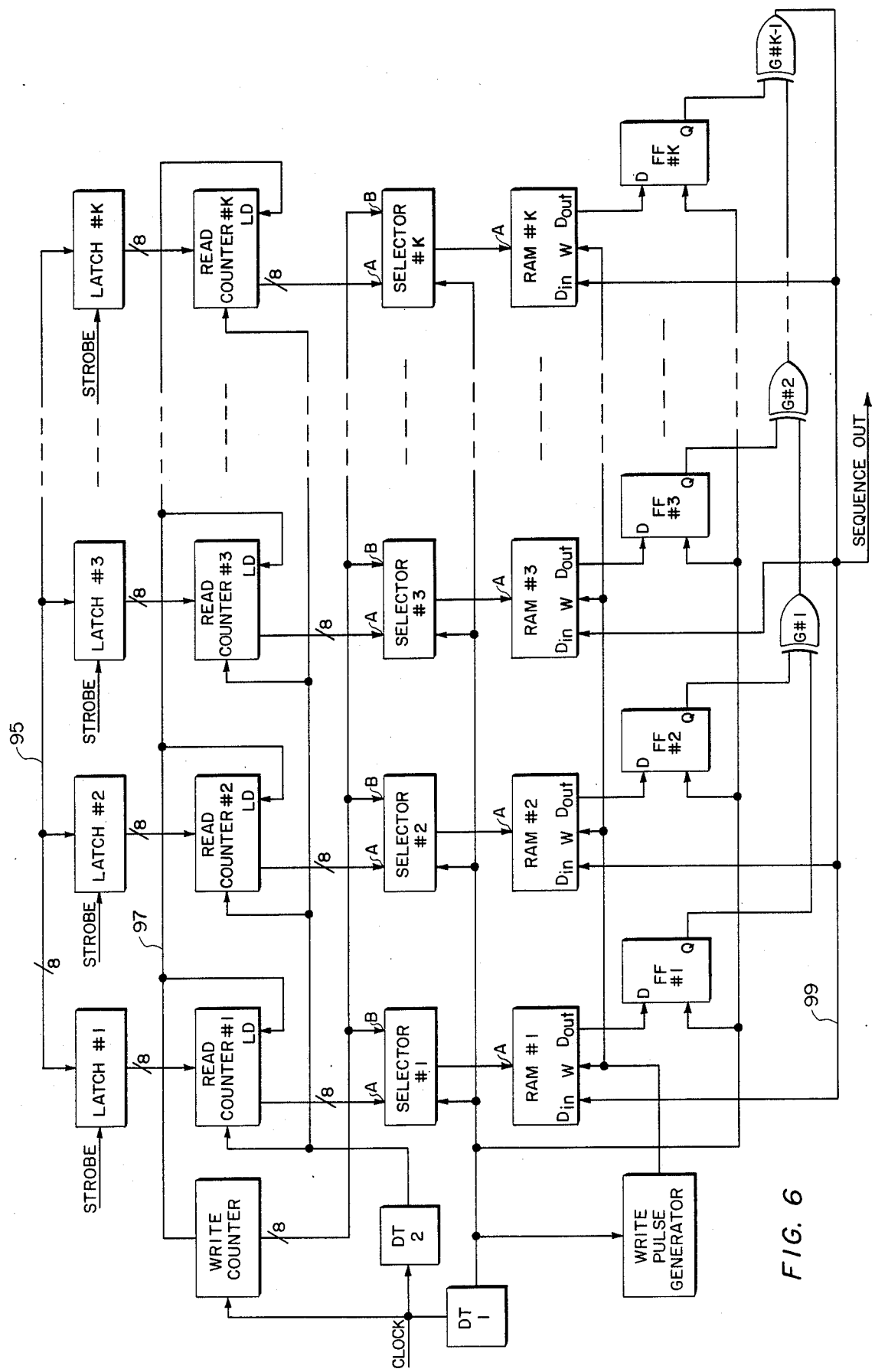
FIG. 6 is another embodiment of the invention.

The present invention also compreses a novel PN generator circuit which is analogous to the shift register circuit of FIG. 5. This novel circuit is shown in FIG. 6. It can be seen that this circuit is similar to that of FIG. 3, but with additional groups or columns of Latch circuits, Read counters, Selectors, RAMs, Flip-Flops, and Ex-Or gates. FIG. 6 comprises k columns of circuits, the first column comprising the Latch #1, Read counter #1, Selector #1, RAM #1, and Flip-Flop (FF) #1. The other columns comprise the same circuitry numbered in sequence #2, #3, . . . #k. Additional columns of similar circuits may be inserted between column #3 and column #k.

The bus 95 has sequentially applied thereto the 8-bit binary numbers which are sequentially loaded into the latch circuits as each one is strobed in turn. The operation of this circuit is similar to that of FIG. 3 and only an abbreviated explanation of the operation thereof is necassary. The single Write counter has its ripple carry output lead 97 connected to the load (LD) inputs of each of the four Read counters, and each time this lead is pulsed the contents of each of the latch circuits preset its associated Read counter. The output of the Write counter is applied to the B input of each of the Selectors and each Read counter output is connected to the A input of its Selector. The Selector outputs are connected to the address (A) inputs of the associated RAMs. The Write pulse generator has its output connected to the Write (W) input of each of the RAMs. Each of the Flip-Flops has its D input connected to the $D_{out}$ terminal of its associated RAM. Clock pulses are provided for the appropriate circuitry just as they are in the circuit of FIG. 3. Ex-Or gate G#1 has as inputs the Q outputs of Flip-Flops #1 and #2. The second Ex-Or gate G#2 has as inputs the output of G#1 and the Q output of FF #3. The Ex-Or gate Gk-1 has as its inputs the output of G#2 and the Q output of FF#k. The output of the last gate G#k-1, lead 99, is connected to the $D_{in}$ terminals of each of the RAMs and it also forms the Sequence Output. It can be seen that the Read counters will lag the Write counter by the complement of the number programmed into the associated latch circuits and further that the digits provided to the gates from the RAMs via the flip-flops will represent past sequence digits which occureed programmable times in the past depending on the number of digits lag of each of the Read counters relative to the Write counter. It can be seen that the gates G#1,—G#k-1 are connected to each other and the RAMs in the same way that the gates of FIG. 5 are connected to the shift register stages, thus FIG. 6 is an analog of FIG. 5 with the important distinction that the circuit of FIG. 6 is capable of generating many more PN sequences of much greater length, and in addition, as explained above, it is programmable.

It should be noted that in FIG. 6 there are one less Ex-Or gates than the number of columns of circuitry (or one less than the number of RAMs). One of the Ex-Or gates, G#1, has as inputs the outputs of two of the RAMs, applied thereto via the two Flip-Flops #1 and #2 which serve as temporary storage media. The other two gates, G#2 and G#k-1 have as inputs the outputs of another one of the RAMs and the output of the Ex-Or gate which is connected to the RAM or RAMs to the left thereof. The circuit of FIG. 6 may include a Zero detector like that of FIG. 3, similarly connected, but this has been omitted to simplify the circuit.

Figure 7:
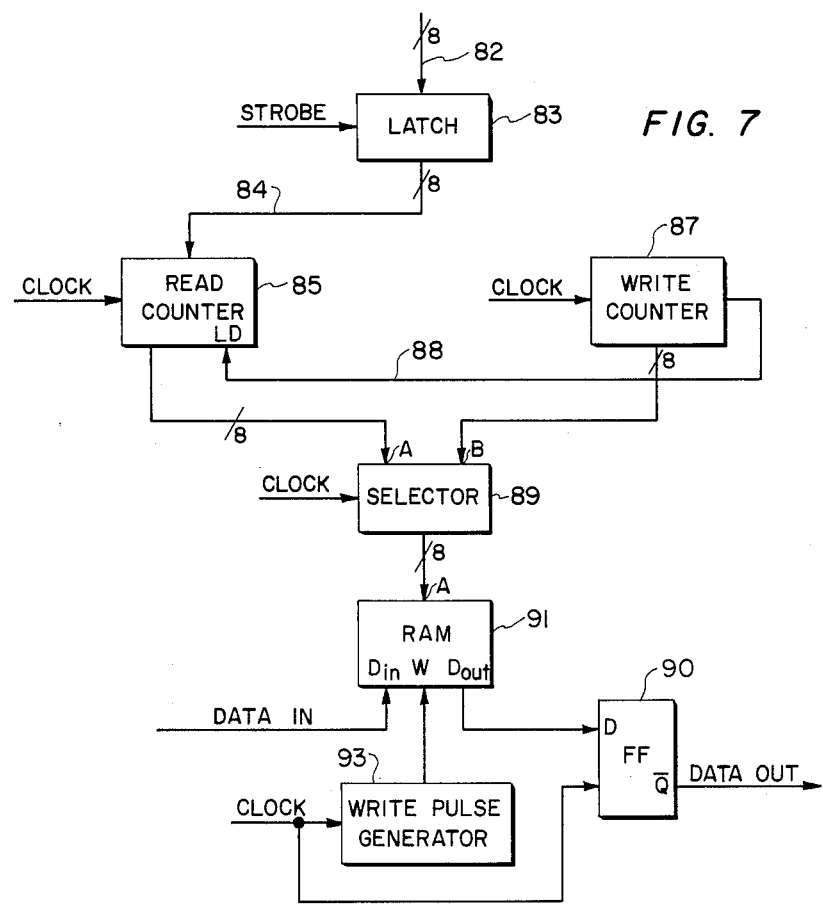
FIG. 7 shows a programmable digital delay circuit which utilizes the concepts of the present invention.

FIG. 7 is a block diagram of a programmable delay circuit which utolizes the concepts of the present invention. This circuit comprises an 8-bit Latch circuit 83 to which an 8-bit number is applied via lead 82. This number determines how much the Read counter 85 lags the Write counter 87 and thus determines the amount of delay imparted to the input data applied to the $D_{in}$ terminal of RAM 91. The delayed data sequence is taken from the $\overline{Q}$ terminal of D-type Flip-Flop 90, which has its D input connected to the $D_{out}$ terminal of the RAM 91. For each bit of lag between the two counters, the output data will be delayed by one bit with respect to the input data. The ripple carry output of the Write counter on lead 88 loads the Read counter with the contents of the latch. The latch contents are selected or programmed as the complement of the desired delay or lag to be imparted to the input data. The circuit functions like those of FIGS. 3 and 6 with the Selector 89 alternately applying the outputs of the two counters to the address (A) input of the RAM, and with read and write modes comprising the two polarities of the clock pulses. Thus, during the write mode the output of the Write Pulse generator 93 causes the current binary bit of the input data at the $D_{in}$ terminal to be stored at the address corresponding to the Write counter output. At a later time depending on the lag of the Read counter, this same address will come up on the Read counter and will be applied to the RAM A terminal during the read mode. The previously stored bit will then appear at the RAM $D_{out}$ terminal as part of the delayed output data to be applied to Flip-Flop 90. The clock circuitry of FIG. 7 has been simplified but it may include one or more delay curcuits used for the previously stated purposes.

While the invention has been described in connection with illustrative embodiments, obvious variations therein will occur to those skilled in this art, accordingly the invention should be limited only by the scope of the appended claims.

What is claimed is:

1. A PN sequence generator comprising first and second Read counters and a Write counter, first and second Random Access Memories (RAMs), said RAMs each comprising an address input (A), a Write terminal (W), and a $D_{in}$ terminal, first and second Selectors, said first Selector arranged to connect, during each read mode, the output of said first Read counter to the address (A) input of said first RAM and also to connect the output of said second Read counter to the address input (A) of said second RAM, both of said Selectors arranged to connect the output of said Write counter to the said address inputs (A) of both of said RAMs during each write mode, means to cause the readings of said Read counters to lag that of said Write counter by different and programmable amounts, means to apply a pulse to the Write terminal (W) of each of said RAMs during each of said write modes, said read and write modes comprising different polarities or haves of each of the clock pulses applied to said circuit, an Exclusive-Or (Ex-Or) gate having as inputs the delayed outputs of each of said RAMs determined by the readings or outputs of the Read counters connected thereto during each of said read modes, the output of said Ex-Or gate forming the PN sequence output, and means to apply the current sequence bit from said Ex-Or gate output to the said $D_{in}$ terminal of each of said RAMs during the said write mode of each clock pulse.

2. The generator of claim 1 wherein first and second D-type Flip-Flops are connected to the output terminals of said first and second RAMs to provide temporary storage or delay for the RAM contents which are applied to said Ex-Or gate.

3. The PN sequence generator of claim 2 wherein said Read and Write counters are binary counters of eight stages and said RAMs have a capacity of 256×1 bits, and wherein first and second 8-bit latch circuits are connected respectively to said first and second Read counters, each said latch circuit presetting its associate Read counter each time that said Write counter reaches its capacity.

4. A pseudo random sequence generator comprising an Ex-Or gate, the said sequence being obtained from the output of said gate, the binary inputs of said gate being obtained from the outputs of a pair of random access memories (RAMs) at different addresses therein pointed to by a different one of two Read counters, a Write counter arranged to point into an address in both of said RAMs wherein the current sequence bit from the output of said gate is stored, and means to program said circuit so that each of said Read counters lags said Write counter by a different and programmable number of digits, said counters being provided with clock pulses which determine the rate of said sequence, whereby the current bit of said sequence is formed by modulo-2 addition, in said gate, of two different prior sequence bits which had been separately stored in said RAMs.

5. A PN sequence generator comprising a plurality of groups of circuits each said group comprising a latch circuit, a Read counter, a Selector, a RAM, and a D-type flip-flop; A write counter having its ripple carry output connected to the load inputs of each of said Read counters, whereby each of said Read counters will be preset to the binary number programmed into its associated latch circuit each time that said Write counter reaches its capacity, the output of each of said Read counters connected to the A input of its associated Selector, the B inputs of all of said Selectors being connected to the output of said Write counter, all of the Selector outputs being connected to the address inputs of their associated RAMs, the outputs of said RAMs being connected to their associated Flip-Flops for the temporary storage therein of the RAM output, a first Ex-Or gate having as inputs the outputs of two of said Flip-Flops, one or more additional Ex-Or gates each having as inputs the output of another of said Flip-Flops and the output of one of said Ex-Or gates, the number of said Ex-Or gates being one less than the number of said groups of circuits, the sequence output being the output of the last one of said Ex-Or gates, said sequence output being connected to the $D_{in}$ terminal of all of said RAMs, a Write Pulse generator arranged to pulse the W terminal of all of said RAMs during a write mode which comprises one polarity of each clock pulse applied to the said counters, and wherein the other polarity of each clock pulse comprises a read mode during which the reading of said Read counters causes the retrieval from its associated RAM of a bit previously stored therein by the action of said Write Pulse generator.

6. A programmable digital delay circuit comprising, a RAM comprising address, $D_{in}$, Write, and $D_{out}$ terminals, means to connect a digital data sequence to be delayed to said $D_{in}$ terminal, a Read counter and a Write counter, means to cause said Read counter to lag said Write counter by a fixed number of digits equal to the delay to be imparted to said digital sequence, a Selector for alternately connecting the outputs of said counters to the A input of said RAM, a Write pulse generator connected to said Write input of said RAM, means to produce a pulse from said write pulse generator during each write mode of each of the clock pulses which operate said counters, whereby the current digit of said digital sequence will be stored at the address of the output of said Write counter, and during a subsequent read mode of each of said clock pulses the output of said Read counter will cause the retrieval of a previously stored bit to be applied to said $D_{out}$ terminal, said $D_{out}$ terminal connected to the D terminal of D-type Flip-Flop, the delayed data output being taken from the $\overline{Q}$ terminal of said Flip-Flop.

* * * * *